United States Patent
Ohtsuki et al.

(10) Patent No.: US 12,368,107 B2
(45) Date of Patent: Jul. 22, 2025

(54) METHOD FOR PRODUCING SEMICONDUCTOR APPARATUS AND SEMICONDUCTOR APPARATUS

(71) Applicant: SHIN-ETSU HANDOTAI CO., LTD., Tokyo (JP)

(72) Inventors: Tsuyoshi Ohtsuki, Annaka (JP); Hiroshi Takeno, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 463 days.

(21) Appl. No.: 17/928,818

(22) PCT Filed: May 26, 2021

(86) PCT No.: PCT/JP2021/019892
§ 371 (c)(1),
(2) Date: Nov. 30, 2022

(87) PCT Pub. No.: WO2022/009547
PCT Pub. Date: Jan. 13, 2022

(65) Prior Publication Data
US 2023/0230926 A1 Jul. 20, 2023

(30) Foreign Application Priority Data
Jul. 7, 2020 (JP) ................................ 2020-117118

(51) Int. Cl.
*H01L 23/538* (2006.01)
*H01L 21/48* (2006.01)
(Continued)

(52) U.S. Cl.
CPC ........ *H01L 23/5385* (2013.01); *H01L 21/486* (2013.01); *H01L 21/76898* (2013.01); *H01L 23/481* (2013.01)

(58) Field of Classification Search
CPC ... H01L 21/486; H01L 23/5384; H01L 23/66; H01L 23/147; H01L 23/5385; H01L 25/0655
See application file for complete search history.

(56) References Cited

U.S. PATENT DOCUMENTS

| | | | |
|---|---|---|---|
| 6,611,419 B1 * | 8/2003 | Chakravorty | ........... H01L 23/50 257/E23.079 |
| 6,617,681 B1 * | 9/2003 | Bohr | ................. H01L 21/76898 257/532 |

(Continued)

FOREIGN PATENT DOCUMENTS

| | | |
|---|---|---|
| JP | H01-169984 A | 7/1989 |
| JP | 2004-079701 A | 3/2004 |

(Continued)

OTHER PUBLICATIONS

Bartek et al., "Characterization of High-Resistivity Polycrystalline Silicon Substrates for Wafer-Level Packaging and Integration of RF Passives," The Fifth International Conference on Advanced Semiconductor Devices and Microsystems, 2004.

(Continued)

*Primary Examiner* — Mohsen Ahmadi
(74) *Attorney, Agent, or Firm* — Oliff PLC

(57) ABSTRACT

A method for producing a semiconductor apparatus capable of producing a semiconductor apparatus with improved transmission loss characteristic using an interposer substrate in which semiconductor devices formed on a silicon single crystal substrate are connected to each other by a through electrode, the method including: a step of providing the silicon single crystal substrate containing a dopant; a step of forming the semiconductor devices and the through electrode on the silicon single crystal substrate to obtain the interposer substrate; and a step of irradiating a particle beam to at least around a formation part for the through electrode (Continued)

on the silicon single crystal substrate to deactivate the dopant in a region around the formation part for the through electrode.

8 Claims, 4 Drawing Sheets

(51) Int. Cl.
*H01L 21/768* (2006.01)
*H01L 23/14* (2006.01)
*H01L 23/48* (2006.01)
*H01L 23/66* (2006.01)
*H01L 25/065* (2023.01)

(56) References Cited

U.S. PATENT DOCUMENTS

| | | | | |
|---|---|---|---|---|
| 2003/0199123 | A1* | 10/2003 | Siniaguine | H01L 23/3128 |
| | | | | 257/E23.152 |
| 2004/0033654 | A1* | 2/2004 | Yamagata | H01L 23/645 |
| | | | | 257/E23.079 |
| 2005/0003649 | A1* | 1/2005 | Takao | H01L 23/481 |
| | | | | 257/E23.021 |
| 2005/0093095 | A1* | 5/2005 | Yamagata | H01L 24/82 |
| | | | | 257/E23.079 |
| 2007/0248699 | A1* | 10/2007 | Baekelmans | A01N 65/34 |
| | | | | 424/765 |
| 2008/0197491 | A1* | 8/2008 | Matsui | H01L 23/60 |
| | | | | 257/E23.079 |
| 2010/0301485 | A1* | 12/2010 | Sekine | H01L 25/0657 |
| | | | | 252/514 |
| 2012/0146177 | A1* | 6/2012 | Choi | H01L 24/97 |
| | | | | 257/528 |
| 2014/0124897 | A1* | 5/2014 | Motoyama | H10D 86/201 |
| | | | | 257/617 |
| 2016/0300768 | A1* | 10/2016 | Kamada | G01N 27/04 |
| 2017/0069598 | A1* | 3/2017 | Nelson | H01L 23/5383 |

FOREIGN PATENT DOCUMENTS

| | | |
|---|---|---|
| JP | 2007-067335 A | 3/2007 |
| JP | 2011-192662 A | 9/2011 |
| JP | 2012-174884 A | 9/2012 |
| JP | 2014-093504 A | 5/2014 |
| JP | 2019-096736 A | 6/2019 |
| KR | 1020160097200 A | 8/2016 |
| KR | 1020170018813 A | 2/2017 |

OTHER PUBLICATIONS

Aug. 17, 2021 International Search Report Issued in International Patent Application No. PCT/JP2021/019892.
Jan. 10, 2023 International Preliminary Report on Patentability Issued in International Patent Application No. PCT/JP2021/019892.
Jan. 13, 2025 Office Action issued in Korean Patent Application No. 10-2022-7045864.

\* cited by examiner

[FIG. 1]
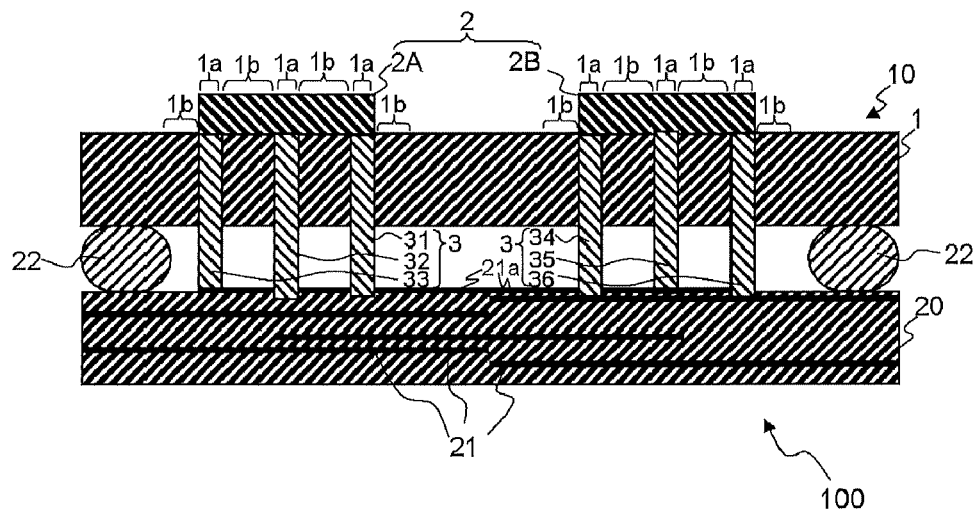
[FIG. 2]
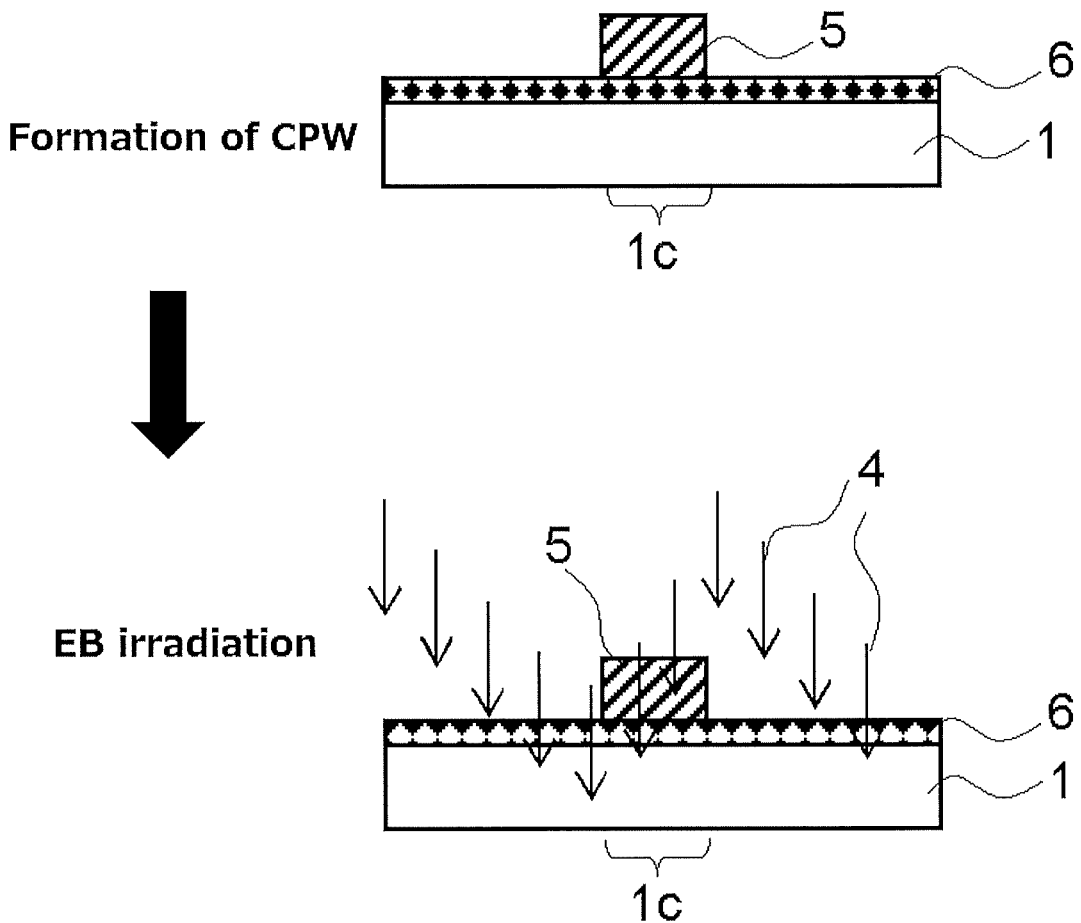

[FIG. 3]
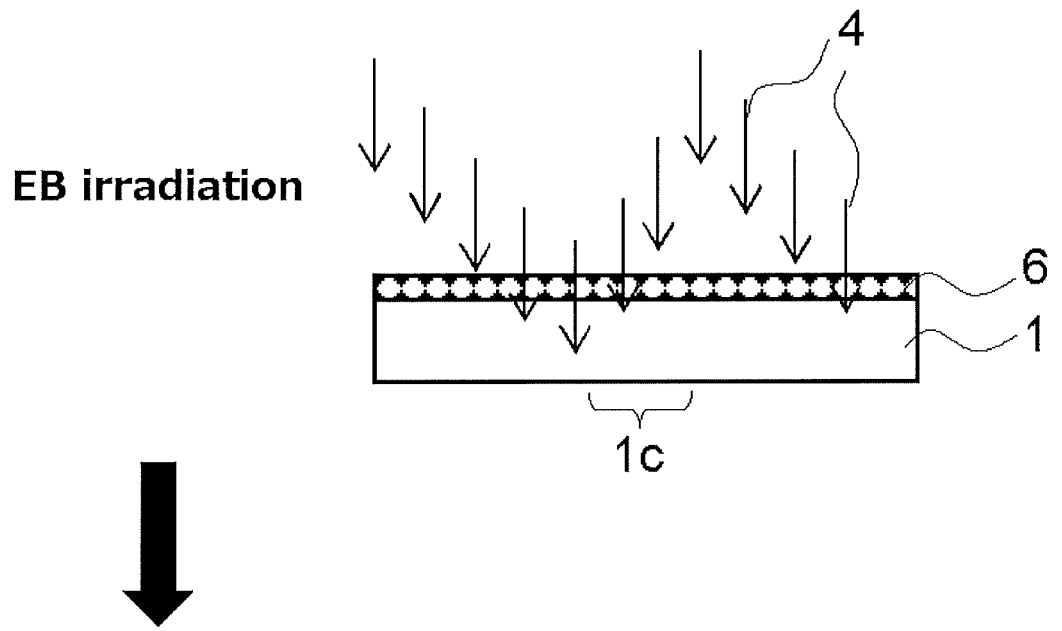
EB irradiation
Formation of CPW
[FIG. 4]
Only formation of CPW
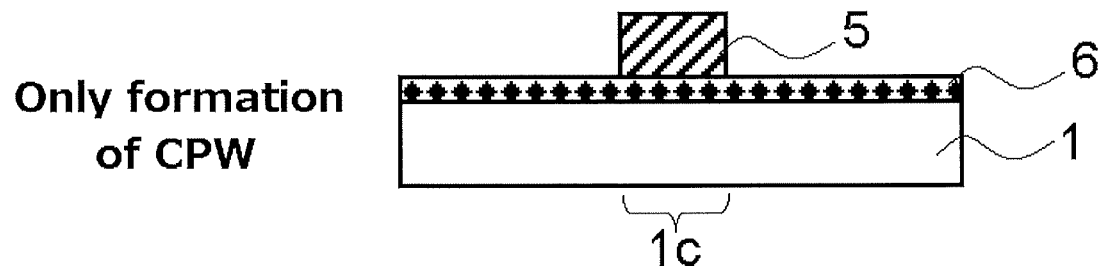

[FIG. 5]
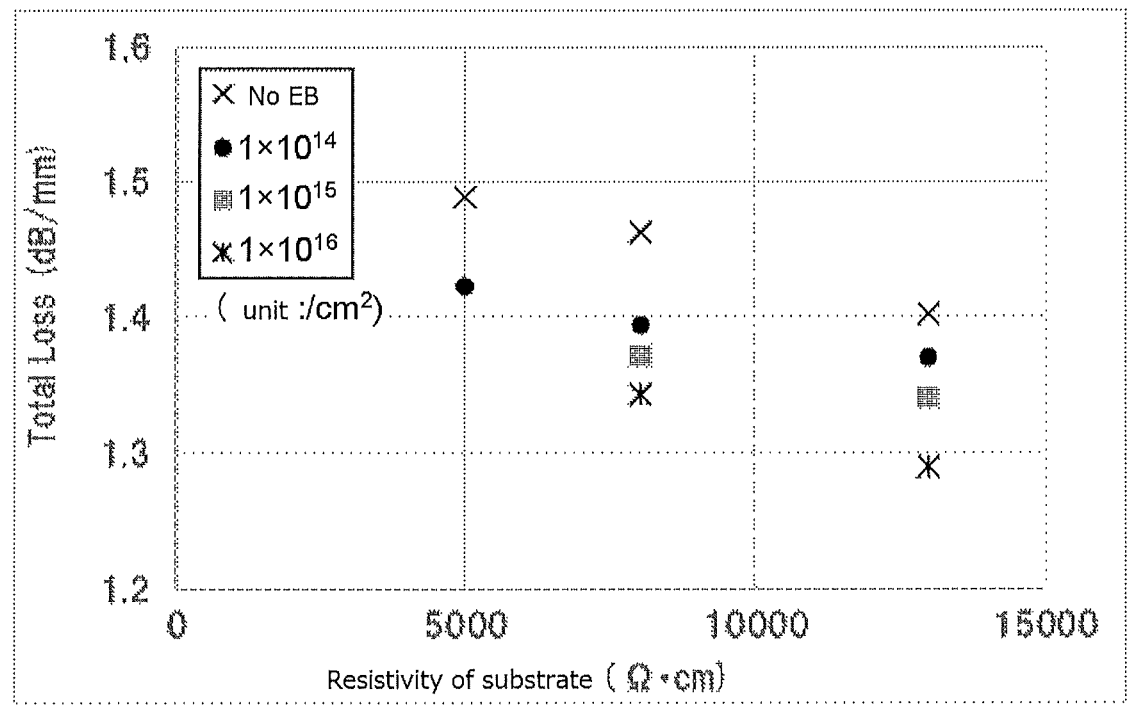
[FIG. 6]
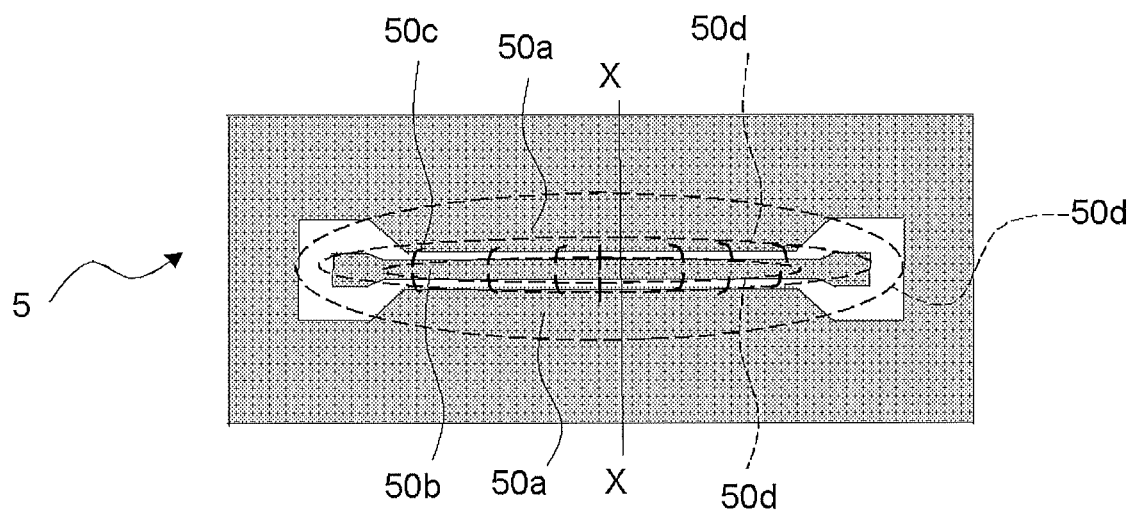

[FIG. 7]
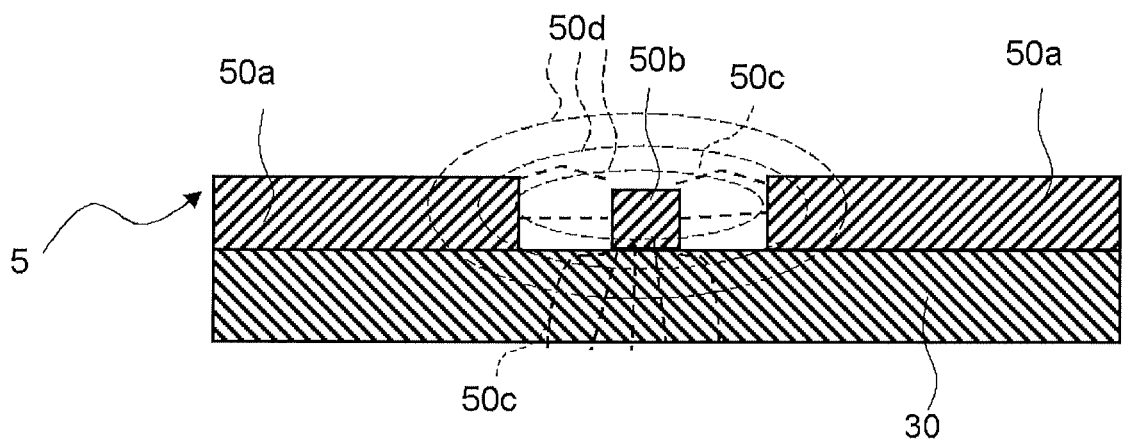
[FIG. 8]
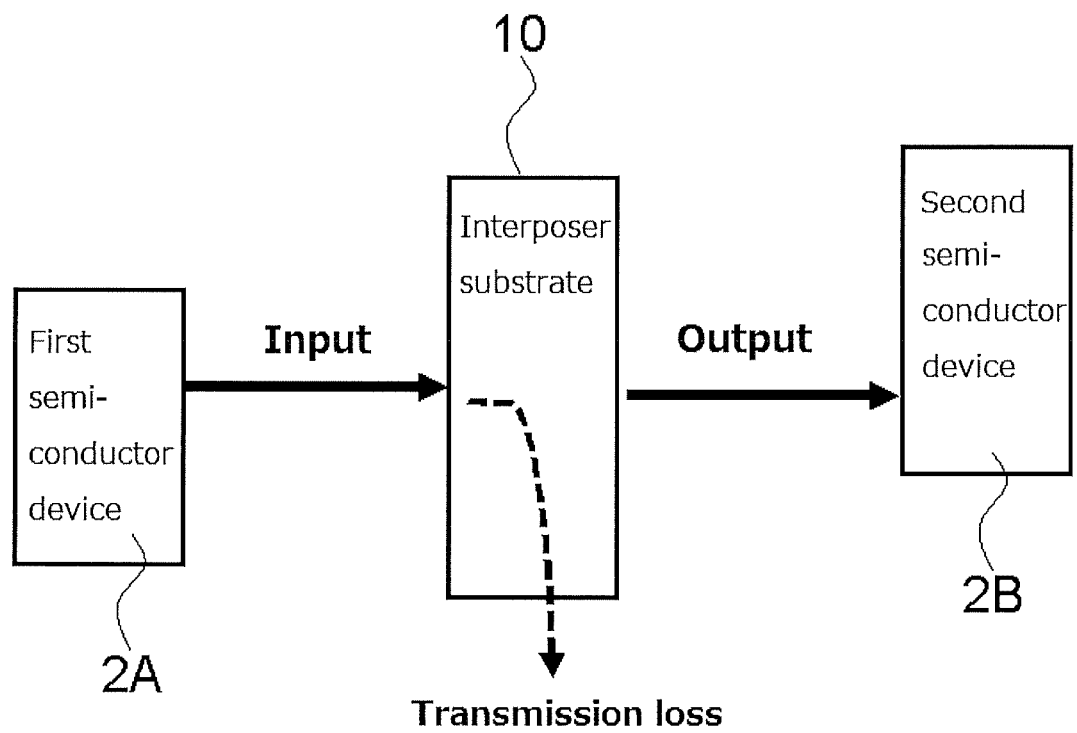

METHOD FOR PRODUCING SEMICONDUCTOR APPARATUS AND SEMICONDUCTOR APPARATUS

TECHNICAL FIELD

The present invention relates to a method for producing a semiconductor apparatus and a semiconductor apparatus.

BACKGROUND ART

With the arrival at 5G, devices are required to be compatible with a wide frequency band, and many high frequency components such as a filter has become necessary. In particular, a semiconductor apparatus used in a high frequency region is required to have improved performance, as well to be smaller, thinner, and densified as a mobile information device.

Further, a CPU is required to operate at a GHz band with increasing of clock frequencies. In a memory as well, for example, a HBM (High Bandwidth Memory) in which DRAMs are stacked in layers are made into products for the purpose of densification. In this case, a TSV (through silicon via) is employed for connecting a memory in each layer.

Under such a background, a silicon interposer using a silicon substrate is used as a wafer level package. Miniaturization becomes possible by using a silicon substrate, as compared with a conventional implementation using a glass epoxy substrate, and thus the silicon interposer has been used in various applications in recent years (for example, Patent Document 1).

In such a CPU, memory, and high frequency device, it is necessary to cause a signal to pass through a metal wiring in a wide band. However, output loss (transmission loss) among the wirings becomes a problem with the increasing of frequencies and progress of miniaturization.

In conventional silicon interposers, a problem was not caused if an insulation film was formed. However, the silicon interposer used for the applications in which communication is required in a high frequency and wide band between devices as described above cannot meet the requirement only with an insulation film with widening of signal bandwidth.

The high frequency transmission characteristics of such a substrate include the transmission loss characteristic measured by forming Co-Planar Waveguide (CPW) 5 of Al electrodes on a substrate with an insulation layer being formed thereon, as shown in FIG. 6 and FIG. 7, and determining a difference between the input power and output power using the CPW 5.

CPW 5 has a structure including, like the example shown in FIG. 6 and FIG. 7, metal electrodes 50*a* arranged in parallel with a gap therebetween, and a linear central metal electrode 50*b* arranged in parallel with the metal electrodes 50*a* at the center part of the gap. CPW 5 is a device 5 for transmitting electromagnetic wave with an electric field 50*c* and a magnetic field 50*d*: the electric field 50*c* is in the direction from the central metal electrode 50*b* to the metal electrodes 50*a* located in right and left sides of the central metal electrode 50*b* in FIG. 7 and to the inside of a substrate for evaluation 30; and the magnetic field 50*d* is in the direction surrounding the central metal electrode 50*b* inside the substrate for evaluation 30.

Actually, for example, Non Patent Document 1 discloses that the transmission loss of a high frequency signal can be improved by using a silicon interposer comprising polysilicon as a substrate material and having high resistivity.

CITATION LIST

Patent Literature

Patent Document 1: JP 2004-79701A
Patent Document 2: JPH01-169984A

NON PATENT LITERATURE

Non Patent Document 1: M. Bartek et al., "Characterization of high-resistivity polycrystalline silicon substrates for wafer-level packaging and integration of RF passives", The Fifth International Conference on Advanced Semiconductor Devices and Microsystems, 2004. ASDAM 2004.

SUMMARY OF INVENTION

Technical Problem

As described above, increasing the resistivity is effective in improving the transmission loss, but it is very difficult to increase the resistivity in silicon substrates. For example, when trying to achieve the electric resistivity of higher than 1000 Ω·cm, it is necessary to obtain extremely low dopant concentration of $1 \times 10^{13}$ atoms/cm$^3$, in a case of P-type boron. Therefore, it has been difficult to achieve an increased resistivity due to the effect of impurities in raw materials.

The present invention has been made for solving the above problems, and aims to provide a method for producing a semiconductor apparatus capable of producing a semiconductor apparatus with improved transmission loss characteristic, and a semiconductor apparatus capable of exhibiting improved transmission loss characteristic.

Solution to Problem

To solve the problem described above, the present invention provides a method for producing a semiconductor apparatus using an interposer substrate in which semiconductor devices formed on a silicon single crystal substrate are connected to each other by a through electrode, the method comprising: a step of providing the silicon single crystal substrate containing a dopant; a step of forming the semiconductor devices and the through electrode on the silicon single crystal substrate to obtain the interposer substrate; and a step of irradiating a particle beam to at least around a formation part for the through electrode on the silicon single crystal substrate to deactivate the dopant in a region around the formation part for the through electrode.

In such a production method, by irradiating a particle beam to at least around the formation part for the through electrode on the silicon single crystal substrate containing a dopant, a point defect may be introduced around the formation part for the through electrode on the silicon single crystal substrate, so that a carrier may be trapped. Accordingly, the dopant in this part can be deactivated. Then, it becomes possible to increase the resistivity at least around the formation part for the through electrode on the silicon single crystal substrate. As a result, a semiconductor apparatus with improved transmission loss characteristic can be produced.

In the semiconductor apparatus produced by the method of the present invention, carriers are trapped at least around the formation part for the through electrode. Therefore, even when the transmission signal is of a high frequency, the number of carriers following the high frequency is small, so that the transmission loss can be suppressed. Accordingly, the semiconductor apparatus produced by the method of the present invention can exhibit excellent high frequency characteristic.

On this case, a silicon single crystal substrate having a resistivity of 500 Ω·cm or more is preferably used as the silicon single crystal substrate.

Thereby, a semiconductor apparatus capable of exhibiting more excellent transmission loss characteristic can be produced.

For example, the semiconductor device and the through electrode can be formed after irradiating the particle beam to at least around the formation part for the through electrode on the silicon single crystal substrate.

Alternatively, the particle beam may be irradiated to at least around the formation part for the through electrode on the silicon single crystal substrate after forming the semiconductor device and the through electrode.

Thus, the step of irradiating the particle beam may be carried out either before or after the formation of the semiconductor device and the through electrode.

As the particle beam, an electron beam is preferably irradiated.

The electron beam is generally used for lifetime control in power devices, as compared with other particle beams. In addition, the electron beam has many advantages such as being highly transparent, and able to be uniformly irradiated in the depth direction of a semiconductor substrate.

Further, the present invention provides a semiconductor apparatus comprising an interposer substrate in which semiconductor devices formed on a silicon single crystal substrate are connected to each other by a through electrode, wherein the silicon single crystal substrate contains a dopant, and the dopant in at least around a formation part for the through electrode on the silicon single crystal substrate is deactivated by irradiation of a particle beam.

In such a semiconductor apparatus, since a dopant in at least around the formation part for the through electrode on the silicon single crystal substrate is deactivated, a region around the formation part for the through electrode on the silicon single crystal substrate can exhibit high resistivity. Accordingly, the semiconductor apparatus of the present invention can exhibit improved transmission loss characteristic.

In addition, in such a semiconductor apparatus, carriers are trapped at least around the formation part for the through electrode. Thus, even when the transmission signal is of a high frequency, the number of carriers following the high frequency is small, and thereby the transmission loss can be suppressed. Accordingly, the semiconductor apparatus of the present invention can exhibit excellent high frequency characteristic.

On this case, the silicon single crystal substrate preferably has the resistivity of 500 Ω·cm or more.

Such a semiconductor apparatus can exhibit more excellent transmission loss characteristic.

Advantageous Effects of Invention

As described above, since the method for producing a semiconductor apparatus of the present invention can achieve increase in the resistivity at least around the formation part for the through electrode on the silicon single crystal substrate, a semiconductor apparatus with improved transmission loss characteristic can be produced. In addition, according to the method for producing a semiconductor apparatus of the present invention, the number of carriers that may follow the high frequency at least around the formation part for the through electrode on the silicon single crystal substrate can be reduced, and therefore a semiconductor apparatus with improved high frequency characteristic can be produced.

Further, the semiconductor apparatus of the present invention can exhibit improved transmission loss characteristic since a region around the formation part for the through electrode on the silicon single crystal substrate can exhibit high resistivity. Furthermore, the semiconductor apparatus of the present invention can exhibit improved high frequency characteristic since the number of carriers that may follow a high frequency is reduced at least around the formation part for the through electrode on the silicon single crystal substrate.

BRIEF DESCRIPTION OF DRAWINGS

FIG. 1 is a schematic illustration showing an example of the semiconductor apparatus of the present invention;

FIG. 2 is a flow chart of Example 1;

FIG. 3 is a flow chart of Example 2;

FIG. 4 is a drawing showing Comparative Example;

FIG. 5 is a graph showing the transmission loss of substrates for evaluation obtained in Example 1 and Comparative Example, respectively;

FIG. 6 is a schematic plan view showing an example of Co-Planar Wave guide (CPW) used for evaluation of the transmission loss characteristic;

FIG. 7 is a cross sectional view of the CPW in FIG. 6 taken along a line segment X-X; and FIG. 8 is a conceptual illustration showing the transmission loss due to an interposer substrate.

DESCRIPTION OF EMBODIMENTS

The present invention relates to a method for producing a semiconductor apparatus and a semiconductor apparatus, and particularly to a packaging technology. More specifically, the present invention relates to a semiconductor apparatus including a silicon interposer substrate in which through wiring is conducted in the silicon to be used for three-dimensional mounting or SiP (System in Package), and a method for producing the same.

First, the transmission loss mentioned above will be described in more detail with reference to FIG. 8, which is a conceptual illustration showing the transmission loss due to an interposer substrate.

FIG. 8 shows a concept of connection between a first semiconductor device 2A and a second semiconductor device 2B using a silicon interposer substrate 10 used for wafer level package, and the like. A signal output from the first semiconductor device 2A is transmitted to the second semiconductor device 2B via the silicon interposer substrate 10. The power output from the silicon interposer substrate 10 to the second semiconductor device 2B may become smaller than the power input to the silicon interposer substrate 10 from the first semiconductor device 2A. That is, the transmission loss may occur by interposing the silicon interposer substrate 10.

The present inventors made intensive investigations for solving the above problems, and as a result, found that irradiation of a particle beam to at least around a formation part for a through electrode on a silicon single crystal substrate containing a dopant can deactivate the dopant around the formation part for the through electrode on the silicon single crystal substrate to increase the resistivity around the formation part for the through electrode, and consequently, the transmission loss due to the silicon interposer substrate can be improved. Thereby, the present inventors completed the present invention.

That is, the present invention is a method for producing a semiconductor apparatus using an interposer substrate in which semiconductor devices formed on a silicon single crystal substrate are connected to each other by a through electrode, the method comprising: a step of providing the silicon single crystal substrate containing a dopant; a step of forming the semiconductor devices and the through electrode on the silicon single crystal substrate to obtain the interposer substrate; and a step of irradiating a particle beam to at least around a formation part for the through electrode on the silicon single crystal substrate to deactivate the dopant in a region around the formation part for the through electrode.

Further, the present invention is a semiconductor apparatus comprising an interposer substrate in which semiconductor devices formed on a silicon single crystal substrate are connected to each other by a through electrode, wherein the silicon single crystal substrate contains a dopant, and the dopant in at least around a formation part for the through electrode on the silicon single crystal substrate is deactivated by irradiation of a particle beam.

Should be noted that Patent Document 2 discloses that by insulation or increasing the resistivity of a p-type InP using a technique such as an electron beam irradiation, it becomes possible to perform highly efficient, high power, and high-speed modulation operation. However, Patent Document 2 does not disclose a technology of increasing the resistivity by irradiation of a particle beam to a region around a formation part for a through electrode in an interposer substrate.

Hereinafter, the present invention will be described in detail with reference to the drawings. However, the present invention is not limited thereto.

Semiconductor Apparatus

The semiconductor apparatus of the present invention includes an interposer substrate in which semiconductor devices formed on a silicon single crystal substrate are connected to each other by a through electrode, wherein the silicon single crystal substrate contains a dopant, and the dopant in at least around a formation part for the through electrode on the silicon single crystal substrate is deactivated by irradiation of a particle beam.

The "deactivation" as used herein refers to deactivation of a dopant by irradiation of a particle beam. While not wishing to be bound by theory, it is considered that point defects are formed in the thus deactivated region around the formation part for the through electrode in the silicon single crystal substrate, and these point defects serve as carrier traps to trap carriers in the silicon single crystal substrate so that the dopant is deactivated. It is considered that the region in which the dopant is deactivated by irradiation of a particle beam can exhibit high resistivity because the carriers are trapped and the number thereof is reduced. Since the number of carriers is thus reduced (resistivity is increased) in the semiconductor apparatus of the present invention, even when the transmission signal is of a high frequency, carriers present around a transmission part (a formation part for a through electrode which connects semiconductor devices to each other) of the silicon single crystal substrate do not follow the high frequency. Such a semiconductor apparatus is considered to be capable of suppressing the transmission loss at a region other than the formation part for the through electrode, and the transmission loss can be eliminated at a region other than the formation part for the through electrode in some cases.

That is, in the semiconductor apparatus of the present invention, since a dopant is deactivated at least around the formation part for the through electrode on the silicon single crystal substrate, and thus the region around the formation part for the through electrode on the silicon single crystal substrate can exhibit high resistivity. As a result, the semiconductor apparatus can exhibit improved transmission loss characteristic.

Moreover, in the semiconductor apparatus of the present invention, the number of carriers that may follow a high frequency is reduced at least around the formation part for the through electrode on the silicon single crystal substrate, and thus improved high frequency characteristic can be exhibited.

The semiconductor apparatus of the present invention is described in more detail hereinbelow.

The semiconductor apparatus of the present invention includes an interposer substrate. In the interposer substrate, semiconductor devices formed on the silicon single crystal substrate are connected to each other by a through electrode. Therefore, the interposer substrate may include a silicon single crystal substrate, semiconductor devices formed on the silicon single crystal substrate, and a through electrode for connecting the semiconductor devices to each other.

The silicon single crystal substrate is not particularly limited if a dopant is contained. The dopant is not particularly limited if a silicon single crystal substrate may contain. Examples of the dopants include, for example, B, Ga, P, Sb, and As.

The silicon single crystal substrate preferably has a resistivity of 500 Ω·cm or more.

By comprising the silicon single crystal substrate exhibiting such a resistivity, more excellent transmission loss characteristic can be exerted.

The higher the resistivity of the silicon single crystal substrate, the more preferable it is. The upper limit thereof is not particularly limited, and it may be 100,000 Ω·cm or less, for example.

The semiconductor device is formed on the silicon single crystal substrate. The semiconductor device may be either a passive device or an active device, or may be a combination of passive and active devices.

The through electrode is formed in the silicon single substrate. A material for the through electrode is not particularly limited, and may be one generally used for electrodes such as a through silicon via (TSV), for example.

The semiconductor apparatus of the present invention may include a member other than the single crystal substrate, the through electrode, and the semiconductor device.

Next, an example of the semiconductor apparatus of the present invention is specifically described with reference to FIG. 1.

A semiconductor apparatus 100 shown in FIG. 1 includes an interposer substrate 10, a connection substrate 20, and bumps 22. The bumps 22 are provided between the interposer substrate 10 and the connection substrate 20.

The interposer substrate 10 includes a silicon single crystal substrate 1. The silicon single crystal substrate 1 contains a dopant.

In the single crystal substrate 1, through electrodes 3 are formed which penetrate the substrate 1 in the thickness direction. FIG. 1 shows six through electrodes 31, 32, 33, 34, 35, and 36 formed in the silicon single crystal substrate 1.

On one main surface of the silicon single crystal substrate 1, semiconductor devices 2 including a first semiconductor device 2A and a second semiconductor device 2B are formed. One end of each of the through electrodes 31, 32, and 33 is connected to the first semiconductor device 2A. Similarly, one end of each of the through electrodes 34, 35, and 36 is connected to the second semiconductor device 2B.

The connection substrate 20 may be a glass epoxy substrate, for example. The connection substrate 20 includes a plurality of internal wirings 21. The internal wirings 21 include an internal wiring 21a located at near the main surface of the connection substrate 20 opposing the interposer substrate 10.

The other end of each of the through electrodes 31, 32, and 33 which is not connected to the first semiconductor device 2A protrudes from the silicon single crystal substrate 1 to reach the connection substrate 20. Similarly, the other end of each of the through electrodes 34, 35, and 36 which is not connected to the second semiconductor device 2B protrudes from the silicon single crystal substrate 1 to reach the connection substrate 20.

As shown in FIG. 1, one ends of the through electrodes 31, 32, and 33 are in contact with one of the internal wiring 21a of the connection substrate 20. Also, one ends of the through electrodes 34, 35, and 36 are in contact with the internal wiring 21a.

Accordingly, the first semiconductor device 2A and the second semiconductor device 2B are connected at least via the through electrodes 31, 32, 33, 34, 35, and 36, as well as the internal wiring 21a.

In the silicon single crystal substrate 1, in a periphery 1b around a formation part 1a for the through electrodes 31, 32, 33, 34, 35, and 36, a dopant is deactivated by irradiation of a particle beam.

Method for Producing Semiconductor Apparatus

The method for producing a semiconductor apparatus of the present invention is a method for producing a semiconductor apparatus using an interposer substrate in which semiconductor devices formed on a silicon single crystal substrate are connected to each other by a through electrode, the method comprising: a step of providing the silicon single crystal substrate containing a dopant; a step of forming the semiconductor devices and the through electrode on the silicon single crystal substrate to obtain the interposer substrate; and a step of irradiating a particle beam to at least around a formation part for the through electrode on the silicon single crystal substrate to deactivate the dopant in a region around the formation part for the through electrode.

According to the method for producing a semiconductor apparatus of the present invention, for example, the semiconductor apparatus of the present invention described above can be produced.

The step of deactivation in the method for producing a semiconductor apparatus of the present invention includes deactivating a dopant at least around the formation part for the through electrode on the silicon single crystal substrate by irradiation of a particle beam. While not wishing to be bound by theory, it is considered that point defects are formed in the silicon single crystal substrate by irradiating a particle beam to at least around the formation part for the through electrode on the silicon single crystal substrate; and the point defects serve as carrier traps to trap carriers in the silicon single crystal substrate, and then the dopant is deactivated. It is considered that the part in which the dopant is deactivated by irradiation of a particle beam is able to show high resistivity because the carriers are trapped and the number thereof is reduced. The method for producing a semiconductor apparatus of the present invention can produce a semiconductor apparatus in which carriers present around a transmission part (a formation part for a through electrode which connects semiconductor devices to each other) of the silicon single crystal substrate do not follow a high frequency even when the transmission signal is of a high frequency by reducing the number of carriers (increasing the resistivity) at least around the formation part for the through electrode. Such a semiconductor apparatus is considered to be capable of suppressing the transmission loss at a region other than the formation part for the through electrode (peripheral part), and the transmission loss can be eliminated at a region other than the formation part for the through electrode in some cases.

That is, the method for producing a semiconductor apparatus of the present invention includes deactivation of a dopant at least around the formation part for the through electrode on the silicon single crystal substrate, and thus the region around the formation part for the through electrode on the silicon single crystal substrate can exhibit high resistivity. As a result, in particular, a semiconductor apparatus which can exhibit improved transmission loss characteristics can be produced.

Moreover, the method for producing a semiconductor apparatus of the present invention can reduce the number of carriers that may follow a high frequency at least around a formation part for the through electrode on the silicon single crystal substrate. Accordingly, a semiconductor apparatus with improved high frequency characteristic can be produced.

The electron beam is generally used for lifetime control in power devices, as compared with other particle beams. In addition, the electron beam has many advantages such as being highly transparent, and able to be uniformly irradiated in the depth direction of a semiconductor substrate. Therefore, it is preferable to irradiate the electron beam as a particle beam.

The particle beam may be irradiated on the whole surface of the substrate which forms a device. This case is more convenient since the particle beam can be irradiated without taking a formation position of the semiconductor element into consideration.

The semiconductor devices and the through electrode can be formed after irradiating the particle beam to at least around the formation part for the through electrode on the silicon single crystal substrate.

Alternatively, the particle beam may be irradiated to at least around the formation part for the through electrode on the silicon single crystal substrate after forming the semiconductor devices and the through electrode.

That is, the particle beam may be irradiated before the formation of the semiconductor devices and the through electrode; or the particle beam may be irradiated after the formation of the semiconductor devices and the through electrode.

When a silicon single crystal substrate having the resistivity of 500 Ω·cm or more is used as the silicon single crystal substrate, a silicon interposer substrate which can exhibit more excellent transmission loss characteristic can be obtained.

By using a silicon single crystal substrate having high resistivity in accordance with the method for producing a semiconductor apparatus of the present invention, not only it is possible to produce a silicon interposer substrate having more preferable transmission loss characteristic than conventional ones, but also it becomes possible to make relatively-low resistivity of a substrate increase. Moreover, even when variation of the transmission loss characteristics exists in the surface of the silicon single crystal substrate (in the case of a silicon single crystal substrate, difference of the resistivity occurs between the center and outer periphery part of the substrate due to the shape of the solid-liquid interface during crystal growth), the variation in the surface can be reduced by irradiation of a particle beam such as an electron beam.

EXAMPLE

Hereinafter, the present invention will be specifically described with reference to Examples and Comparative Example. However, the present invention is not limited thereto.

Example 1

In Example 1, substrates for evaluation were produced by the following procedures according to the flow chart shown in FIG. 2. A through hole for a through electrode was not formed in the substrates for evaluation.

First, boron-doped, high-resistivity silicon single crystal substrates 1 (5000, 8000, and 13000 Ω·cm) with a diameter of 200 mm produced by a CZ method were provided. For evaluation of the transmission loss characteristic of these substrates 1, a 400 nm-thick thermal oxide film 6 was formed on each of the surfaces of the silicon single crystal substrates 1.

Next, to a region 1c including a formation part for a through electrode and a periphery thereof on each of the substrates 1, CPW 5 (waveguide length: 2200 µm) having the similar structure as those described with reference to FIG. 6 and FIG. 7, a device formed with aluminum electrodes, was produced.

Thereafter, electron beam 4 was irradiated on the whole surfaces of the substrates 1 (acceleration: 2 MeV, dose amount: $1 \times 10^{14}$ to $1 \times 10^{16}/cm^2$). Thereby, the substrates for evaluation of Example 1 were obtained.

For each of the substrates for evaluation of Example 1, the transmission loss (a difference between input power of −10 dBm at the frequency of 1 GHz and measured output power) was measured.

Example 2

In Example 2, substrates for evaluation were produced by the following procedures according to the flow chart shown in FIG. 3. A through hole for a through electrode was not formed in the substrates for evaluation.

First, boron-doped, high-resistivity silicon single crystal substrates 1 (5000, 8000, and 13000 Ω·cm) with a diameter of 200 mm produced by a CZ method were provided. For evaluation of the transmission loss characteristic of these substrates 1, a 400 nm-thick thermal oxide film 6 was formed on each of the surfaces of the silicon single crystal substrates 1.

Then, electron beam 4 was irradiated on the whole surfaces of the substrates 1 (acceleration: 2 MeV, dose amount: $1 \times 10^{14}$ to $1 \times 10^{16}/cm^2$).

Thereafter, to a region 1c including a formation part for a through electrode and a periphery thereof on each of the substrates 1, CPW 5 (waveguide length: 2200 µm) having the similar structure as those described with reference to FIG. 6 and FIG. 7, a device formed with aluminum electrodes, was produced. Thereby, the substrates for evaluation of Example 2 were obtained.

For each of the substrates for evaluation of Example 2, the transmission loss (a difference between input power of −10 dBm at the frequency of 1 GHz and measured output power) was measured.

Comparative Example

In Comparative Example, substrates for evaluation were produced by the following procedures according to the flow chart shown in FIG. 4. A through hole for a through electrode was not formed in the substrates for evaluation.

First, boron-doped, high-resistivity silicon single crystal substrates 1 (5000, 8000, and 13000 Ω·cm) with a diameter of 200 mm produced by a CZ method were provided. For evaluation of the transmission loss characteristic of these substrates 1, a 400 nm-thick thermal oxide film 6 was formed on the surfaces of the silicon single crystal substrates 1.

Thereafter, to a region 1c including a formation part for a through electrode and a periphery thereof on each of the substrates 1, CPW 5 (waveguide length: 2200 µm) having the similar structure as those described with reference to FIG. 6 and FIG. 7, a device formed with aluminum electrodes, was produced. Thereby, the substrates for evaluation of Comparative Example were obtained. That is, the substrates for evaluation of Comparative Example were produced without irradiating an electron beam.

For each of the substrates for evaluation of Comparative Example, the transmission loss (a difference between input power of −10 dBm at the frequency of 1 GHz and measured output power) was measured.

Result

FIG. 5 shows the transmission loss (Total Loss (dB/mm)) in each of the substrates for evaluation of Example 1 and Comparative Example 1. The transmission loss shown in FIG. 5 is a transmission loss at the frequency of 1 GHz, and the substrate exhibiting lower transmission loss is superior in the transmission loss characteristic, particularly when transmitting a high frequency.

The result of Example 1 shown in FIG. 5 indicates that the transmission loss characteristic depends on the resistivity of the silicon single crystal substrate 1 and the amount of irradiation of the particle beam (electron beam). However, the result also indicates that even with the silicon single crystal substrates 1 having the same resistivity, by irradiating the particle beam, it is possible to produce a substrate for evaluation showing lower transmission loss characteristic than that obtained by the method of Comparative Example (conventional method) in which no particle beam is irradiated, that is, the transmission loss characteristic can be improved as compared with a conventional method.

Additionally, Example 2 showed the similar result as in Example 1. That is, the result of Example 2 also indicates that the transmission loss characteristic depends on the resistivity of the silicon single crystal substrate 1 and the amount of irradiation of the particle beam (electron beam). However, the result indicates that even with the silicon single crystal substrates 1 having the same resistivity, by irradiating the particle beam, it is possible to produce a substrate for evaluation showing lower transmission loss characteristics than that obtained by the method of Comparative Example (conventional method) in which no particle beam is irradiated, that is, the transmission loss characteristic can be improved as compared with a conventional method.

On the other hand, it can be seen that the substrates for evaluation of Comparative Example in which no particle beam was irradiated showed larger transmission loss than the substrates for evaluation of Examples 1 and 2 in which the silicon single crystal substrates 1 having the same resistivity were used. That is, the substrates for evaluation of Comparative Example were inferior in the transmission loss characteristic.

It is thought that these results were due to the fact that the dopant in a region around the formation part for the through electrode could be deactivated by irradiating a particle beam to at least around the formation part for the through electrode on the silicon single crystal substrate containing the dopant, and thereby the resistivity at least around the formation part for the through electrode on the silicon single crystal substrate could be increased, as in the present invention.

Further, as shown in Examples 1 and 2, the same effect of irradiation of the electron beam could be obtained either before or after the wiring. These results show that a semiconductor apparatus with excellent transmission loss characteristic can be produced in both cases in which the through electrode and the semiconductor devices are formed after irradiating the particle beam around the formation part for the through electrode on the silicon single crystal substrate containing a dopant, and in which the particle beam is irradiated around the formation part for the through electrode on the silicon single crystal substrate containing a dopant after forming the through electrode and the semiconductor devices.

In Examples 1 and 2 described above, the transmission loss characteristic was evaluated for the substrates for evaluation 1 in which CPW 5 and the thermal oxidation film 6 was formed. And the results of Examples 1 and 2 demonstrate that a semiconductor apparatus produced in the same manner as in Examples 1 and 2 except that a through electrode was formed in the region 1c and semiconductor devices connected by the through electrode were formed in place of formation of CPW 5 and the thermal oxide film 6 can exhibit improved transmission loss characteristic.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:
1. A method for producing a semiconductor apparatus using an interposer substrate in which semiconductor devices formed on a silicon single crystal substrate are connected to each other by a plurality of through electrodes, the method comprising:
   a step of providing the silicon single crystal substrate containing a dopant;
   a step of forming the semiconductor devices and the plurality of through electrodes on the silicon single crystal substrate to obtain the interposer substrate; and
   a step of irradiating a particle beam to at least around a formation part for the through electrode on the silicon single crystal substrate to deactivate the dopant in a region around the formation part for the through electrode,
   wherein one end of each of the plurality of through electrodes which is not connected to the semiconductor devices protrudes from the silicon single crystal substrate to reach a connection substrate,
   wherein a silicon single crystal substrate having a resistivity of 500 Ω·cm or more is used as the silicon single crystal substrate.

2. The method for producing a semiconductor apparatus according to claim 1, wherein the particle beam is irradiated to at least around the formation part for the through electrode on the silicon single crystal substrate after forming the semiconductor devices and the through electrode.

3. The method for producing a semiconductor apparatus according to claim 2, wherein an electron beam is irradiated as the particle beam.

4. The method for producing a semiconductor apparatus according to claim 1, wherein an electron beam is irradiated as the particle beam.

5. A method for producing a semiconductor apparatus using an interposer substrate in which semiconductor devices formed on a silicon single crystal substrate are connected to each other by a through electrode, the method comprising:
   a step of providing the silicon single crystal substrate containing a dopant;
   a step of forming the semiconductor devices and the through electrode on the silicon single crystal substrate to obtain the interposer substrate; and
   a step of irradiating a particle beam to at least around a formation part for the through electrode on the silicon single crystal substrate to deactivate the dopant in a region around the formation part for the through electrode,
   wherein a silicon single crystal substrate having a resistivity of 500 Ω·cm or more is used as the silicon single crystal substrate, and
   wherein the semiconductor devices and the through electrode are formed after irradiating the particle beam to at least around the formation part for the through electrode on the silicon single crystal substrate.

6. The method for producing a semiconductor apparatus according to claim 5, wherein an electron beam is irradiated as the particle beam.

7. A semiconductor apparatus comprising:
   an interposer substrate in which semiconductor devices formed on a silicon single crystal substrate are connected to each other by a through electrode,
   wherein the silicon single crystal substrate contains a dopant, and the dopant in at least around a formation part for the through electrode on the silicon single crystal substrate is deactivated by irradiation of a particle beam,
   wherein the silicon single crystal substrate has a resistivity of 500 Ω·cm or more, and
   wherein the semiconductor devices and the through electrode are formed after irradiating the particle beam to at least around the formation part for the through electrode on the silicon single crystal substrate.

8. A semiconductor apparatus comprising:
   an interposer substrate in which semiconductor devices formed on a silicon single crystal substrate are connected to each other by a plurality of through electrodes, wherein the silicon single crystal substrate contains a dopant, and the dopant in at least around a formation part for the plurality of through electrodes on the silicon single crystal substrate is deactivated by irradiation of a particle beam, wherein the silicon single crystal substrate has a resistivity of 500 Ω·cm or more, and wherein the particle beam is irradiated to at least around the formation part for the plurality of through electrodes on the silicon single crystal substrate after forming the semiconductor devices and the plurality of through electrodes, wherein the plurality of through electrodes penetrate the silicon single crystal substrate and one end of each of the plurality of through electrodes which is not connected to the semiconductor devices protrudes from the silicon single crystal substrate to reach a connection substrate.

* * * * *